(12) United States Patent
Hayashi et al.

(10) Patent No.: US 9,211,805 B2
(45) Date of Patent: Dec. 15, 2015

(54) POWER SOURCE MONITOR

(75) Inventors: Kensuke Hayashi, Chiyoda-ku (JP);
Shingo Yamaguchi, Chiyoda-ku (JP);
Keiichi Enoki, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 913 days.

(21) Appl. No.: 13/447,735

(22) Filed: Apr. 16, 2012

(65) Prior Publication Data
US 2013/0119756 A1 May 16, 2013

(30) Foreign Application Priority Data
Nov. 10, 2011 (JP) .................................. 2011-246227

(51) Int. Cl.
| B60L 1/00 | (2006.01) |
| B60L 11/18 | (2006.01) |
| B60W 10/06 | (2006.01) |
| B60W 10/08 | (2006.01) |
| B60W 10/26 | (2006.01) |
| H01M 10/48 | (2006.01) |
| G01R 31/36 | (2006.01) |

(52) U.S. Cl.
CPC ......... *B60L 11/1868* (2013.01); *B60L 11/1861* (2013.01); *B60W 10/06* (2013.01); *B60W 10/08* (2013.01); *B60W 10/26* (2013.01); *H01M 10/48* (2013.01); *B60L 2240/429* (2013.01); *B60L 2240/547* (2013.01); *B60L 2240/549* (2013.01); *G01R 31/362* (2013.01); *Y02T 10/642* (2013.01); *Y02T 10/7005* (2013.01); *Y02T 10/7044* (2013.01); *Y02T 10/7066* (2013.01)

(58) Field of Classification Search
None
See application file for complete search history.

(56) References Cited

U.S. PATENT DOCUMENTS

| 2001/0020789 A1* | 9/2001 | Nakashima ................. 290/40 C |
| 2003/0001544 A1* | 1/2003 | Nakanishi ..................... 320/162 |
| 2009/0015201 A1* | 1/2009 | Fukumura et al. ............ 320/130 |

FOREIGN PATENT DOCUMENTS

| JP | 1138104 A | 2/1999 |
| JP | 11-103505 A | 4/1999 |
| JP | 2003004822 A | 1/2003 |
| JP | 206170808 A | 6/2006 |
| JP | 4039323 B2 | 1/2008 |
| JP | 2011069639 A | 4/2011 |
| JP | 4880451 B2 | 2/2012 |
| WO | 2005116675 A1 | 12/2005 |

OTHER PUBLICATIONS

Japanese Office Action issued Jul. 23, 2013, Patent Application No. 2011-246227.
Japanese Office Action issued Mar. 26, 2013, Patent Application No. 2011-246227.

* cited by examiner

*Primary Examiner* — Jared Fureman
*Assistant Examiner* — Joel Barnett
(74) *Attorney, Agent, or Firm* — Sughrue Mion, PLLC; Richard C. Turner

(57) ABSTRACT

A power source current control unit (102) controls a magnetic-field current PWM control signal (PW) for PWM-controlling a magnetic-field current of an electric rotating machine (3) so that the value of a power source current flowing in a power source apparatus (2) can be controlled in a non-energization manner to be zero or a value near to zero; in the case where the power source voltage stability determination unit (104) determines that during a predetermined period, variation in a power source inter-terminal voltage value (V) of the power source apparatus (2) is within a predetermined range, the power source SOC estimation unit (101) estimates the state of charge of the power source apparatus (2), based on the voltage value (V) of the power source apparatus (2).

13 Claims, 11 Drawing Sheets

POWER SOURCE MONITOR

BACKGROUND OF THE INVENTION

1. Field of the Invention

The present invention relates to a power source monitor that monitors the state of charge of a power source apparatus mounted in a vehicle.

2. Description of the Related Art

In recent years, there has been developed a vehicle in which as a technology for reducing fuel consumption by the vehicle, kinetic energy is recovered, as electric power, through regenerative power generation when the vehicle is decelerated. There has been developed a vehicle in which for the purpose of efficiently performing regenerative power generation, a battery (e.g., a lithium-ion battery) having a large charging/discharging allowable capacity and a high energy density is mounted. In the case of such a battery as described above, for the purpose of lengthen the lifetime and raising the safety of the battery, the state of charge (referred to as SOC, hereinafter) of the battery need to be monitored more strictly than in the case of a lead battery so that the battery is prevented from being overcharged or overdischarged. In addition, in order to increase the amount of recovery, it is important to comprehend and manage the SOC of the battery.

In a vehicle utilizing a conventional lead battery, when the lead battery discharges, deterioration develops; therefore, the SOC is always controlled so as to keep the lead battery almost fully charged. The SOC of the lead battery is estimated in the following manner. After the vehicle has been started, the amount of charge in the lead battery is increased, and when the amount of charge in the lead battery is saturated and hence the current value becomes small, it is considered that the lead battery has been fully charged; then, from the timing of the full charging, the amount of charging and discharging currents are integrated for the purpose of estimating the SOC of the battery. For example, with regard to a vehicle equipped with a lead battery and a power-generation motor that can operate as both an electric power generator and a motor, there has been proposed a battery state monitoring apparatus (e.g., refer to Patent Document 1). In the battery state monitoring apparatus, after the internal combustion engine of the vehicle has been started, power generation by the power-generation motor is once interrupted so as to make the battery discharge; the charging current for the battery is gradually increased under the condition that the polarization states inside the battery have been made uniform; when the charging current for the battery becomes minute, the SOC is estimated from the voltage across the battery.

PRIOR ART REFERENCE

Patent Document

[Patent Document 1] Japanese Patent No. 4039323

In the conventional apparatus disclosed in Patent Document 1, for the purpose of estimating the SOC through the open voltage of the power source, after the internal combustion engine of a vehicle has been started, power generation by the power-generation motor is interrupted so as to make the battery discharge; under the condition that the polarization states inside the battery have been made uniform, the power-generation amount is gradually increased and hence the charging current for the battery is gradually increased; then, when the charging current becomes minute, the voltage across the lead battery is obtained. However, for example, when overlapping with the ending timing of the operation of an electric load such as an electric retractable side mirror, the timing of detecting the voltage across the lead battery may be missed.

In the current and voltage generated by the power-generation motor, there are caused pulsations that are caused when the generated electromotive force is rectified or that are caused through the PWM (Pulse Width Modulation) control of the magnetic-field current flowing in the magnetic-field winding, and the pulsations cause errors in the detected values of the charging current and the voltage across the lead battery; however, as far as the conventional apparatus disclosed in Patent Document 1 is concerned, no measures for the errors in the detected values have been disclosed.

SUMMARY OF THE INVENTION

The present invention has been implemented in order to solve the foregoing problems in conventional power source monitors; the objective thereof is to obtain a power source monitor that can accurately monitor the state of charge of a power source.

A power source monitor according to the present invention is mounted in a vehicle equipped with an electric rotating machine performing driving-power communication with an internal combustion engine, as a driving power source for a vehicle, and a power source apparatus being provided with an electricity storage function and performing electric-power communication with the electric rotating machine, and that monitors at least a state of charge of the power source apparatus. The power source monitor includes a power source current control unit that controls a magnetic-field current PWM control signal for PWM-controlling a magnetic-field current of the electric rotating machine so that the value of a power source current flowing in the power source apparatus can be controlled to be zero or a value near to zero; a power source non-energization determination unit that determines whether or not the value of the power source current flowing in the power source apparatus is zero or a value near to zero; a power source voltage stability determination unit that determines whether or not a variation in a power source inter-terminal voltage value of the power source apparatus is within a predetermined range during a predetermined period, when the power source non-energization determination unit determines that the value of the power source current is zero or a value near to zero; and a power source SOC estimation unit that estimates a state of charge of the power source apparatus, based on the voltage value of the power source apparatus, when the power source voltage stability determination unit determines that the variation in the power source inter-terminal voltage value is within the predetermined range. Based on a state of charge estimated by the power source SOC estimation unit, the state of charge of the power source apparatus is monitored.

In the case where the value of the power source current flowing in the power source apparatus is zero or a value near to zero and the variation in the power source inter-terminal voltage value of the power source apparatus is within a predetermined range during a predetermined period, the power source monitor according to the present invention estimates the state of charge of the power source apparatus, based on the power source inter-terminal voltage value of the power source apparatus; thus, the state of charge of the power source apparatus can securely be estimated, and based on this estimation, the state of charge of the power source can accurately be monitored.

The foregoing and other object, features, aspects, and advantages of the present invention will become more appar-

DETAILED DESCRIPTION OF THE PREFERRED EMBODIMENTS

Embodiment 1

Figure 1:
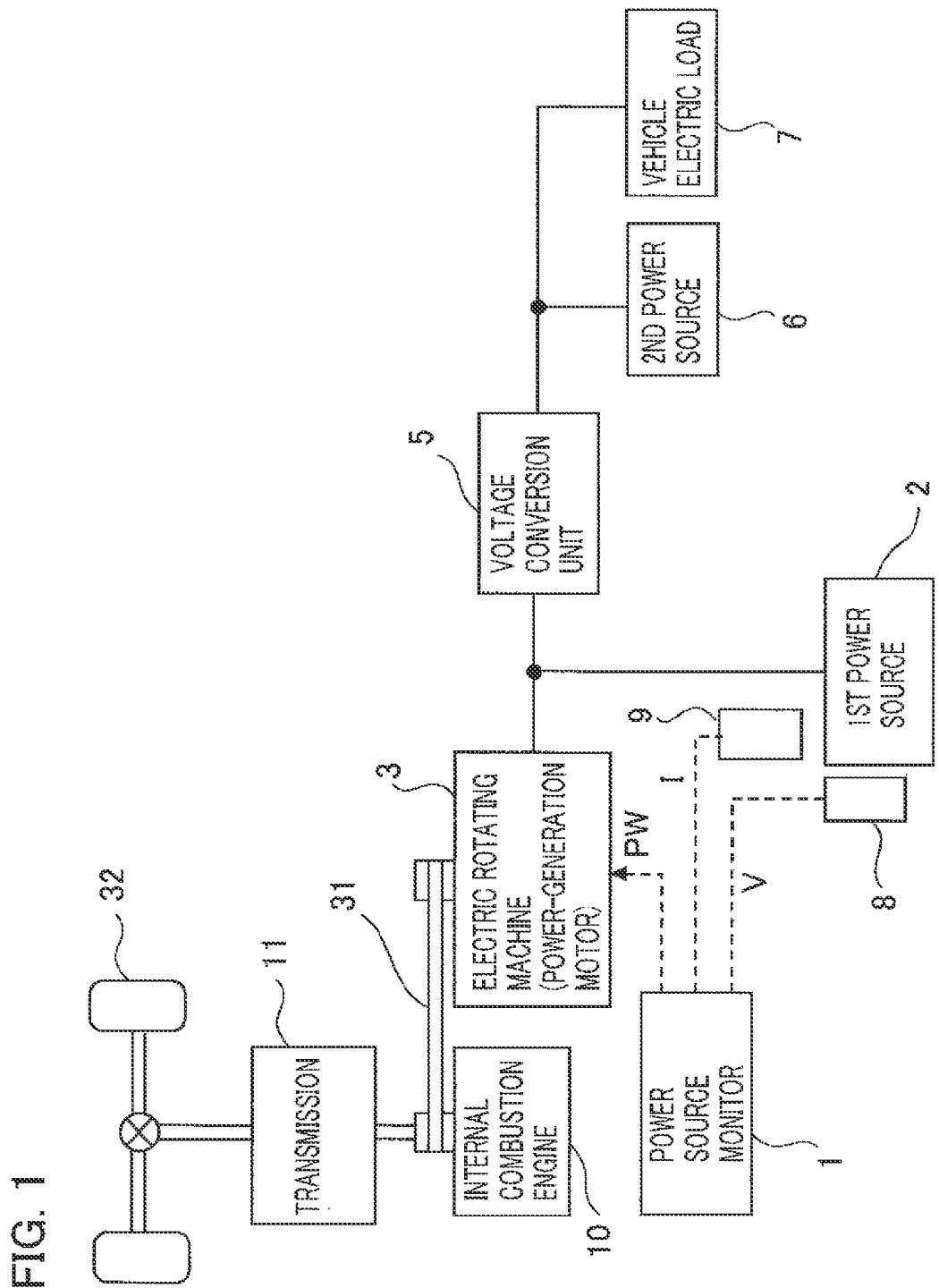
FIG. 1 is a block diagram of a vehicle provided with a power source monitor according to Embodiment 1 of the present invention.

FIG. 1 is a block diagram of a vehicle provided with a power source monitor according to Embodiment 1 of the present invention. In FIG. 1, the rotor shaft of an motor generator (referred to as an electric rotating machine, hereinafter) 3 is coupled with the crankshaft of an internal combustion engine 10, by the intermediary of a belt 31; in the case where the rotor thereof is driven through the belt 31 by the internal combustion engine 10, the electric rotating machine 3 operates as an electric power generator so as to generate electric power; in contrast, in the case where electric power is supplied to the armature winding thereof, the electric rotating machine 3 operates as a motor so as to drive the internal combustion engine 10 by the intermediary of the belt 31.

The internal combustion engine 10 exchanges driving power with drive wheels 32 of the vehicle, by the intermediary of a transmission 11. The electric rotating machine 3 is connected with a first power source 2, which is a power source apparatus, in such a way that they can exchange electric power with each other; the electric rotating machine 3 is also connected with a voltage conversion unit 5 in such a way that they can exchange electric power with each other. The first power source 2 is formed of a battery having a large charging/discharging allowable capacity and a high energy density such as a lithium-ion battery. The voltage conversion unit 5 converts electric power supplied from the electric rotating machine 3 or the first power source 2 and supplies the converted electric power to a second power source 6 and an electric load 7 of the vehicle. The second power source 6 is formed of a battery such as a lead battery; the second power source 6 storages electric power supplied from the voltage conversion unit 5 and supplies electric power to the electric load 7 of the vehicle.

The power source monitor 1 according to Embodiment 1 of the present invention obtains a power source inter-terminal voltage value V from a power source inter-terminal voltage detection unit 8 provided in the first power source 2 and a power source current value I from a power source current detection unit 9 provided in the first power source 2; the power source monitor 1 also generates a magnetic-field current PWM control signal PW for PWM-controlling a magnetic-field current flowing in the magnetic-field winding of the electric rotating machine 3 so as to variably control the power-generation amount of the electric rotating machine 3.

Figure 2:
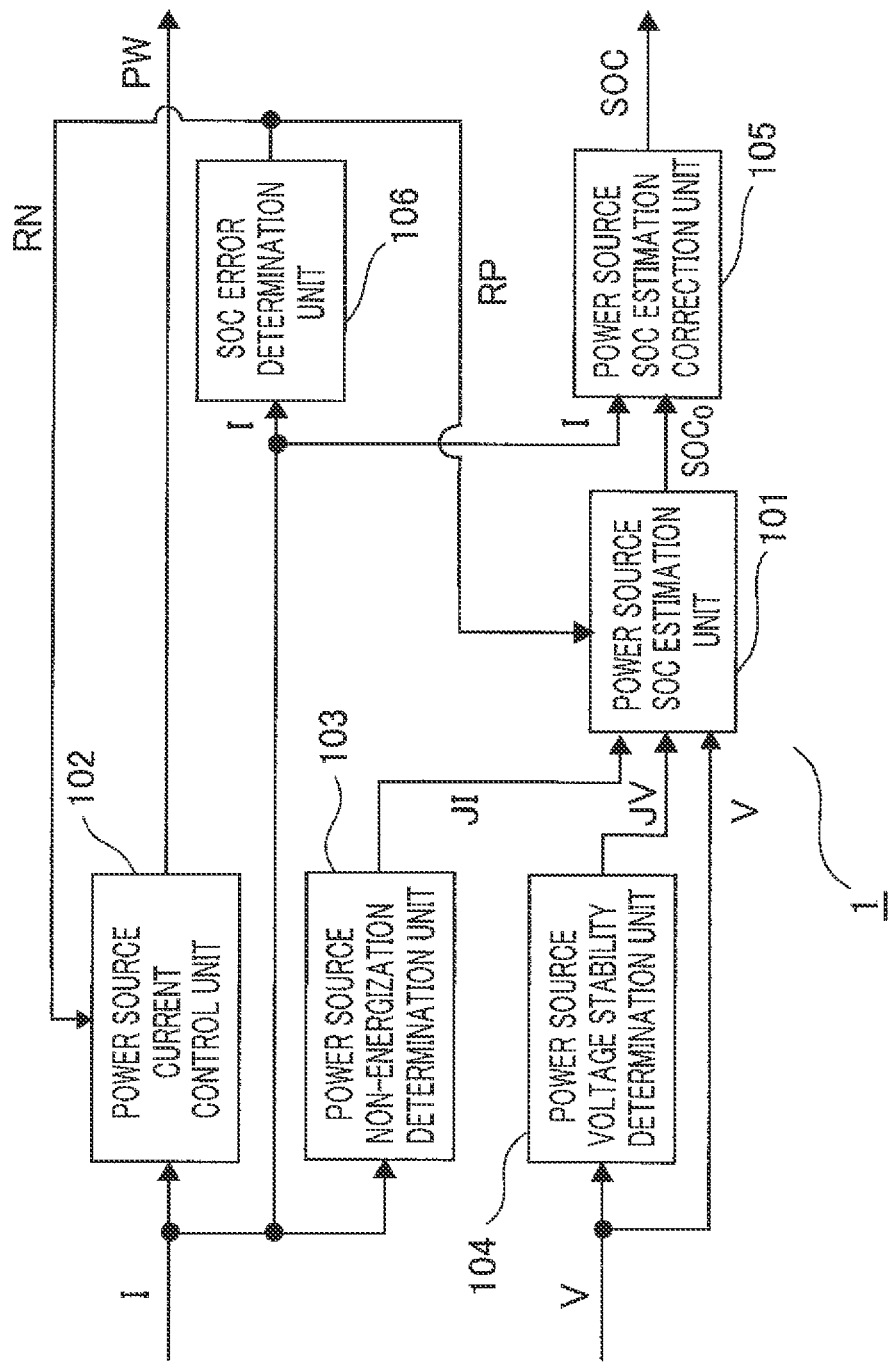
FIG. 2 is a block diagram illustrating internal processing during power-source SOC estimation operation by a power source monitor according to Embodiment 1 of the present invention.

FIG. 2 is a block diagram illustrating internal processing during power-source SOC estimation operation by a power source monitor according to Embodiment 1 of the present invention. In FIG. 2, when receiving a power source non-energization control demand RN from an SOC error determination unit 106, the power source current control unit 102 outputs the magnetic-field current PWM control signal PW to the electric rotating machine 3 so as to perform a feedback control calculation in such a way that the power source current value I obtained from the power source current detection unit 9 becomes zero. A power source non-energization determination unit 103 monitors the power source current value I; in the case where the power source current value I becomes zero or near to zero, it is determined that the energization has been stopped, and then the power source non-energization determination unit 103 outputs a determination result JI to a power source SOC estimation unit 101.

A power source voltage stability determination unit 104 monitors the power source inter-terminal voltage value V from the power source inter-terminal voltage detection unit 8; in the case where during an after-mentioned predetermined power source voltage stability determination period, the variation in the power source inter-terminal voltage value V is within a power source voltage stability determination threshold value, the power source voltage stability determination unit 104 determines that the power source voltage has stabilized, and then outputs a determination result JV to the power source SOC estimation unit 101. The foregoing power source voltage stability determination period and the power source voltage stability determination threshold value are set based on the characteristics of the power source. For example, the power source voltage stability determination period is set to 200 [msec], and the power source voltage stability determination threshold value is set to 10 [mV].

Figure 4:
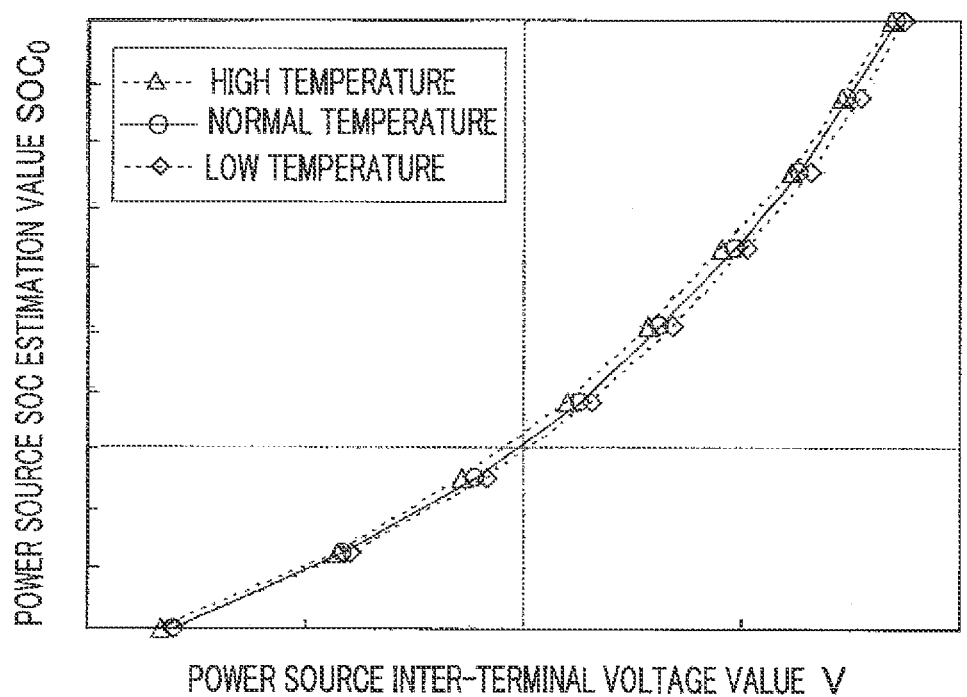
FIG. 4 is a power source SOC estimation map for obtaining the SOC estimation value of a power source, based on a power source inter-terminal voltage value, in a power source monitor according to Embodiment 1 of the present invention.

During the foregoing non-energization control, the power source SOC estimation unit 101 obtains the power source inter-terminal voltage value V every specific sampling cycle; from the power source inter-terminal voltage value V obtained at the time when the power source non-energization determination unit 103 determines that the energization has been stopped and the power source voltage stability determination unit 104 determines that the power source has stabilized, the power source SOC estimation unit 101 obtains a power source SOC estimation value $SOC_0$ with reference to the power source SOC estimation map, for example, represented in FIG. 4, that is prepared therein.

That is to say, FIG. 4 is a power source SOC estimation map for obtaining the SOC estimation value of the power source, based on the power source inter-terminal voltage value, in the power source monitor according to Embodiment 1 of the present invention; the ordinate denotes the power source SOC estimation value $SOC_0$, and the abscissa denotes the power source inter-terminal voltage value V. The characteristics of the power source inter-terminal voltage value V and the power source SOC estimation value $SOC_0$ depend on the temperature of the power source; therefore, it may be allowed that the power source SOC estimation map is preliminarily set for each representative temperature; the power source temperature is obtained from a separately provided power source temperature detection unit; then, based on the power source SOC estimation value obtained from the power source SOC estimation map at the representative temperature close to the power source temperature, the power source SOC estimation value $SOC_0$ at the detected power source temperature is obtained.

In the case where the vehicle is initially started from its stop mode, the SOC error determination unit 106 determines that the reliability of the power source SOC estimation value $SOC_0$ has been deteriorated, and then issues a power source SOC estimation processing demand RP to the power source SOC estimation unit 101 so as to make power source SOC estimation processing to be performed; concurrently, the SOC error determination unit 106 issues the non-energization control demand RN to the power source current control unit 102. In addition, the SOC error determination unit 106 obtains an integration value by integrating the absolute values of the power source current values I for a time from the time point when the power source SOC estimation processing has been performed last time to the present time point; also in the case where the foregoing integration value exceeds a predetermined accumulated error allowable current integration value, the SOC error determination unit 106 determines that the reliability of the power source SOC estimation value $SOC_0$ has been deteriorated, and then issues again a power source SOC estimation processing demand RP to the power source SOC estimation unit 101 so as to make power source SOC estimation processing to be performed; concurrently, the SOC error determination unit 106 issues the non-energization control demand RN to the power source current control unit 102. In consideration of the accuracy of the power source current detection unit 9 to be utilized, the accumulated error allowable current integration value is set, for example, to 10C (1C=the full charge capacity of the power source).

A power source SOC correction unit 105 integrates the power source current values I and, by utilizing the integration value, corrects power source SOC estimation value $SOC_0$ obtained by the power source SOC estimation unit 101, based on the following equation (1).

$$SOC = SOC_0 + (\int I dt \div A) \qquad (1)$$

where SOC is the power source SOC estimation value corrected by the power source SOC correction unit 105; $SOC_0$ is the power source SOC estimation value obtained by the power source SOC estimation unit 101; I is the power source current value; and A is the full charge capacity [Ampere second] of the first power source 2.

Figure 3:
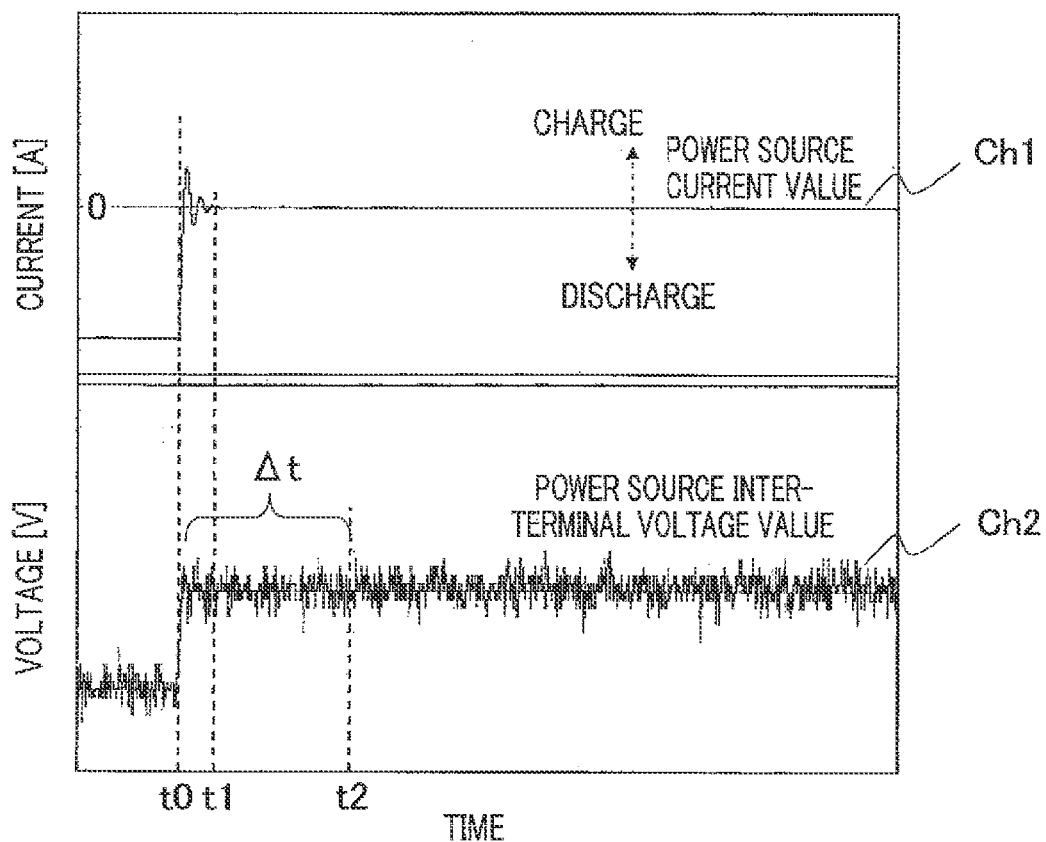
FIG. 3 is a timing chart for explaining the operation flow of power-source SOC estimation operation by a power source monitor according to Embodiment 1 of the present invention.

FIG. 3 is a timing chart for explaining the operation flow of power-source SOC estimation operation by the power source monitor according to Embodiment 1 of the present invention.

In FIG. 3, the ordinate denotes the voltage [V] (upper portion) and the current [I] (lower portion); the abscissa denotes the time. In FIG. 3, Ch1 represents the temporal transition of the foregoing power source current value I, and Ch2 represents the temporal transition of the foregoing power source inter-terminal voltage value V. At the time point t0, the power source current control unit 102 outputs the magnetic-field current PWM control signal PW, whereby the magnetic-field current that flows in the magnetic-field winding of the electric rotating machine 3 is controlled in such a way that the power source current value becomes zero or near to zero.

At the time point t1, the power source current value becomes near to zero; the power source non-energization determination unit 103 determines that energization is not performed and outputs the determination result JI to the power source SOC estimation unit 101. Next, at the time point t2, in the case where during the power source voltage stability determination period Δt, the variation in the power source inter-terminal voltage value V is within the power source voltage stability determination threshold value, the power source voltage stability determination unit 104 determines that the power source voltage has stabilized, and then outputs the determination result JV to the power source SOC estimation unit 101. Furthermore, at the time point t2, by use of the power source inter-terminal voltage value V at the time point t2, the power source SOC estimation unit 101 obtains the power source SOC estimation value $SOC_0$ with reference to the power source SOC estimation map represented in FIG. 4.

In FIG. 3, as an example, the power source SOC estimation processing is started from a time point when the first power source 2 has discharged; however, the energization direction and the magnitude of the current of the first power source 2 are not defined in particular, when the power source SOC estimation processing is started. On the condition that while the vehicle is in the stop mode or before the vehicle is started, the electric rotating machine 3 and the voltage conversion unit 5 are in the stop mode, i.e., on the condition that there exists no path through which the current enter or exit from the first power source 2, zero-point calibration for the power source current detection unit 9 is carried out; as a result, the accuracy of the power source SOC estimation can further be raised.

Figure 5:
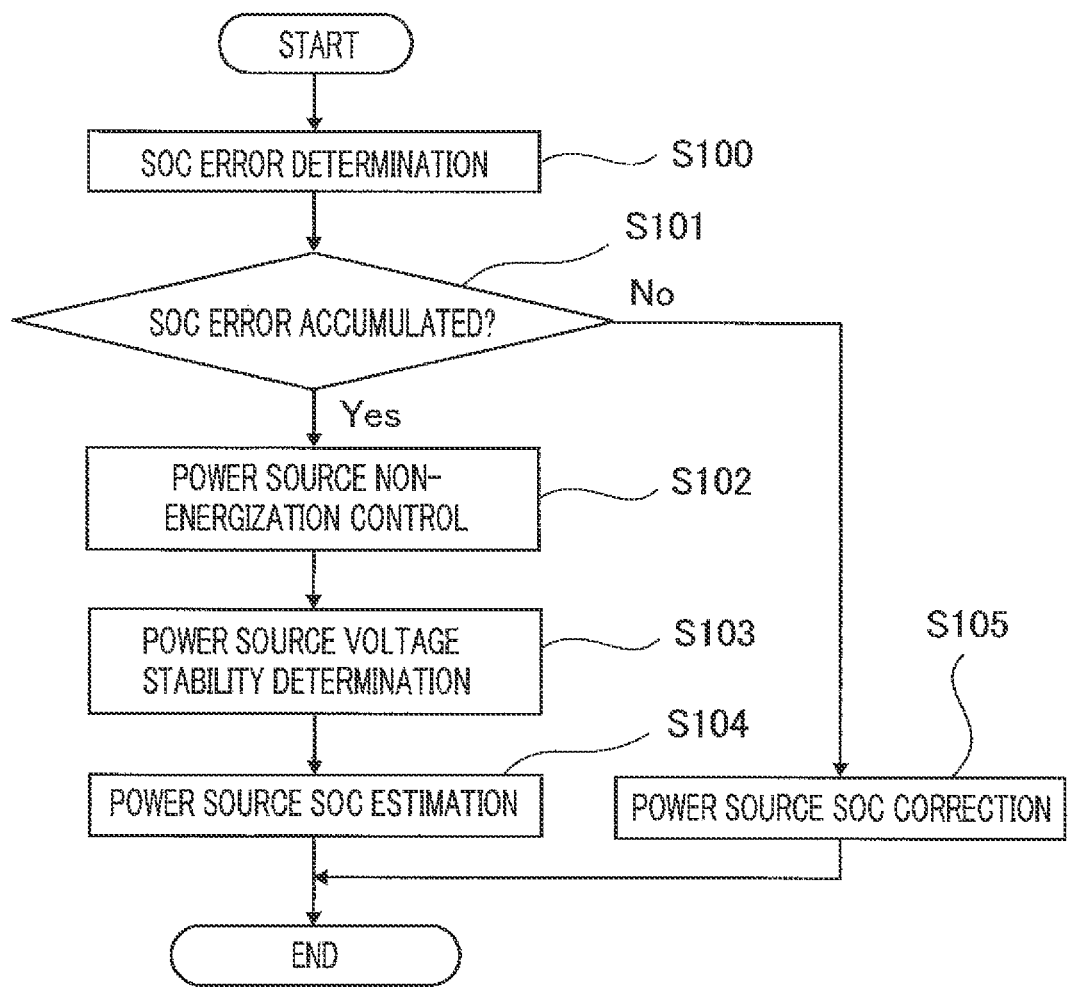
FIG. 5 is a flowchart representing the flow of the operation of a power source monitor according to Embodiment 1 of the present invention.

Next, the operation of the power source monitor according to Embodiment 1 of the present invention will be explained. FIG. 5 is a flowchart representing the flow of the operation of the power source monitor according to Embodiment 1 of the present invention; this processing is repeated every predetermined period. In FIG. 5, at first, in the step S100, the SOC error determination unit 106 calculates the integration value of the absolute values of the power source current values I obtained after the last-time power source SOC estimation so as to start the SOC error determination processing; in the step S101, the SOC error determination unit 106 determines whether or not the integration value, calculated in the step S100, of the absolute values of the power source current values I has exceeded a predetermined accumulated error allowable current integration value. In the case where in the step S101, it is determined that the integration value of the absolute values of the power source current values I has exceeded the predetermined accumulated error allowable current integration value (Yes), it is determined that the error in the power source SOC estimation value has accumulated and hence the reliability has deteriorated, and then the step S101 is followed by the step S102; in the case where it is determined that the integration value of the absolute values of the power source current values I has not exceeded the predetermined accumulated error allowable current integration value (No), the step S101 is followed by the step S105.

In the step S102, the power source current control unit 102 outputs the magnetic-field current PWM control signal PW to the electric rotating machine 3 so as to perform non-energization control in such a way that the obtained power source current value I becomes zero or near to zero. After that, when the power source current value I becomes zero or a value near to zero, the power source current control unit 102 determines that energization is not performed, and outputs the determination result JI; then, the step S102 is followed by the processing in the step S103.

In the step S103, in the case where during the power source voltage stability determination period Δt represented in FIG. 3, the variation in the power source inter-terminal voltage value V is within a predetermined power source voltage stability determination threshold value, the power source voltage stability determination unit 104 determines that the power source voltage has stabilized, and then outputs the determination result JV; then, the step S103 is followed by the processing in the step S104. In the step S104, based on the power source inter-terminal voltage value V obtained at that time, the power source SOC estimation unit 101 obtains the power source SOC estimation value $SOC_0$ with reference to the power source SOC estimation map represented in FIG. 4; then, the processing is ended.

In contrast, in the case where in the step S101, it is determined that the integration value of the absolute values of the power source current values I has not exceeded the predetermined accumulated error allowable current integration value (No), the step S101 is followed by the processing in the step S105. The power source SOC correction unit 105 integrates the absolute values of the obtained power source current values I and, based on the integration value, corrects power source SOC estimation value $SOC_0$ obtained in the foregoing step S104 so as to create the power source SOC estimation value SOC; then, the processing is ended.

The power source monitor according to Embodiment 1, described above, of the present invention makes it possible to perform the power source SOC estimation as soon as possible, even when due to the SOC or the temperature, the characteristics in the time from a time point when energization by the power source is stopped to a time point when the inter-terminal voltage stabilizes changes; appropriate setting of the number of power source non-energization control operations based on the power source SOC estimation or the period thereof makes it possible to reduce the effect on the vehicle fuel consumption while maintaining the accuracy of the power source SOC estimation and to reduce the probability that the opportunity of regenerative power generation is missed when the vehicle is decelerated.

Moreover, in the power source monitor according to Embodiment 1 of the present invention, the magnetic-field current PWM control signal for PWM-controlling the magnetic-field current of the electric rotating machine is controlled in such a way that the power source current value flowing in the first power source becomes zero or near to zero, so that non-energization control is performed; the power source inter-terminal voltage is periodically obtained during the non-energization control; when variation in the power source inter-terminal voltage stops, the power source SOC estimation processing is ended as soon as possible; then, the non-energization control can be ended. This method makes it possible to obtain the power source inter-terminal voltage value corresponding to the open voltage, without undergoing the effects of a voltage drop caused by a current flowing to the power source and polarization of the power source; therefore, the SOC of the power source can accurately be estimated. Rapid ending of the power source SOC estimation processing makes it possible to hold the effect on the vehicle fuel consumption within a critical mass; thus, there can be reduced the probability that the opportunity of regenerative power generation is missed when the vehicle is decelerated. Furthermore, even in the case where due to a factor such as the temperature of the power source, the SOC of the power source, or the condition of deterioration, the time necessary for the power source inter-terminal voltage to stabilize changes, the power source SOC estimation processing can be ended without undergoing such a factor.

Still moreover, when the integration value, obtained by integrating the absolute values of the power source current values from a timing when the power-source SOC estimation has been performed last time, becomes the same as or larger than a predetermined value, the power source monitor according to Embodiment 1 of the present invention performs again the power source SOC estimation. As a result, in the case where errors accumulate in the power source SOC estimation value, which is corrected by integrating the values of currents with which the power source is charged or discharged, a power source SOC estimation value is obtained again; therefore, the accuracy of the power source SOC estimation value can be maintained, whereby the number of power source estimation operations to be performed can be kept within a critical mass.

Embodiment 2

Next, a power source monitor according to Embodiment 2 of the present invention will be explained. In the power source monitor according to Embodiment 1, the magnetic-field current of the electric rotating machine is PWM-controlled in such a way that in response to an instruction for non-energization control, the power source current becomes zero or a value near to zero, and then the power source SOC estimation is performed based on the power source inter-terminal voltage; however, in a power source monitor according to Embodiment 2, in addition to the above method, the effect of noise caused when the electric rotating machine generates electric power is reduced for the purpose of raising the accuracy of the power source SOC estimation.

Figure 6:
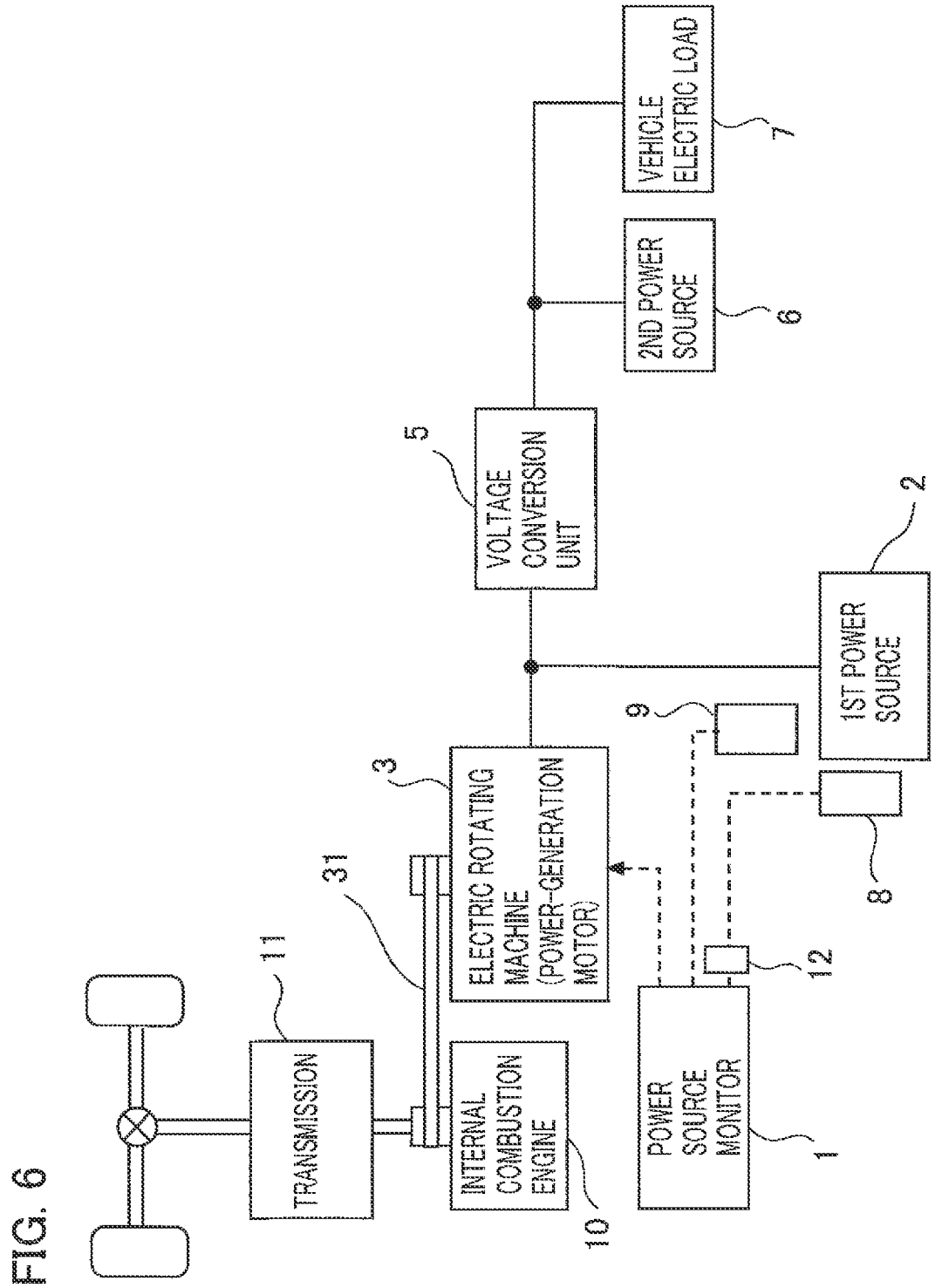
FIG. 6 is a block diagram of a vehicle provided with a power source monitor according to Embodiment 2 of the present invention.

FIG. 6 is a block diagram of a vehicle provided with a power source monitor according to Embodiment 2 of the present invention; constituent elements the same as or equivalent to those in FIG. 1 are designated by the same reference numerals. In FIG. 6, a filter circuit 12 eliminates high-frequency voltage oscillations, which contribute to the formation of electric double layers in the terminals of the first power source 2, among voltage oscillations of the power source inter-terminal voltage value V outputted by the power source inter-terminal voltage detection unit 8, and outputs the power source inter-terminal voltage value V to the power source monitor 1. The other configurations are the same as those in FIG. 1 of Embodiment 1; therefore, the explanation therefor will be omitted.

Figure 7:
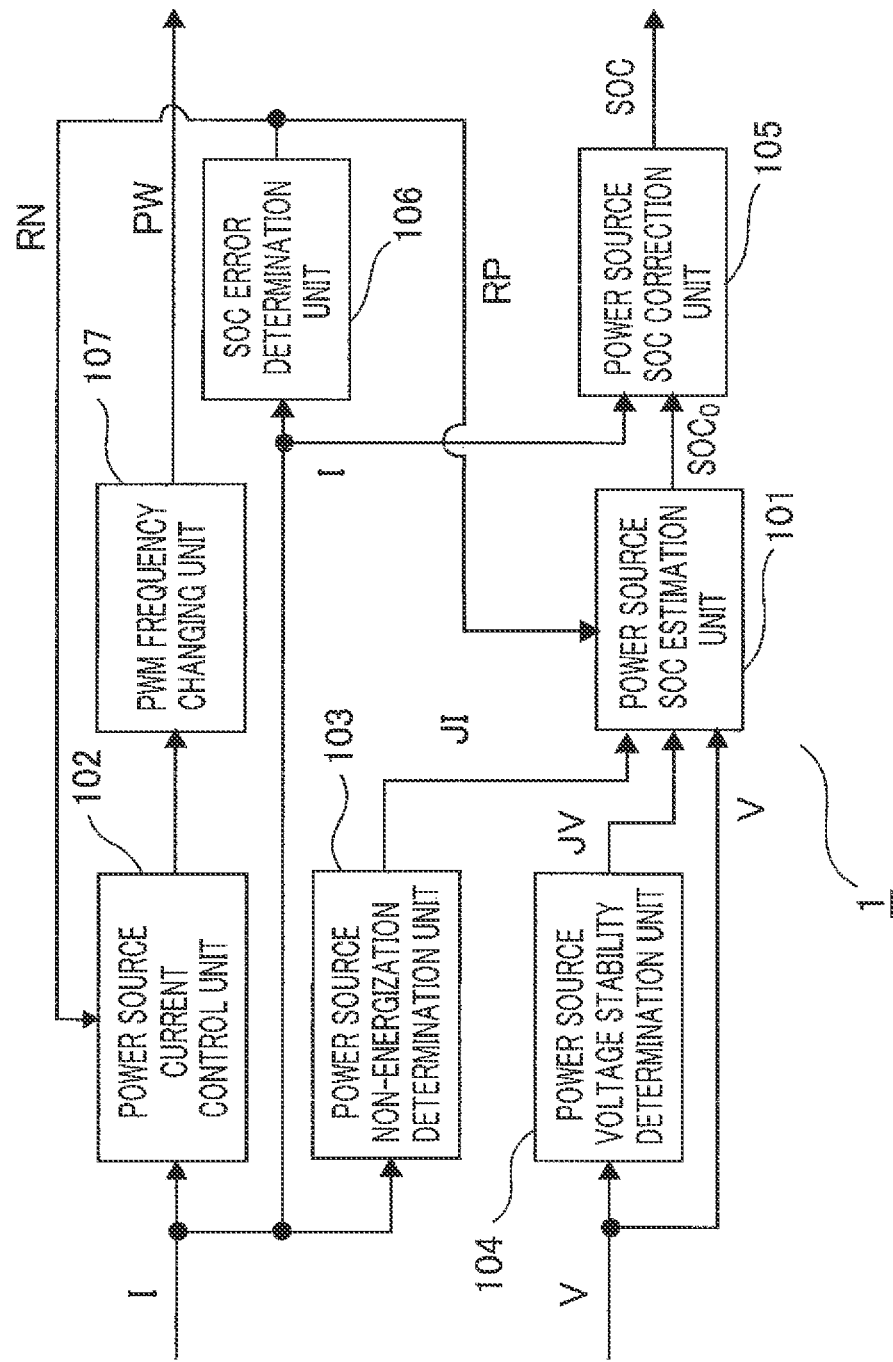
FIG. 7 is a block diagram illustrating internal processing during power-source SOC estimation operation by a power source monitor according to Embodiment 2 of the present invention.

FIG. 7 is a block diagram illustrating internal processing during power-source SOC estimation operation by a power source monitor according to Embodiment 2 of the present invention. With regard to the internal processing, in FIG. 7, of the power source monitor 1, constituent elements the same as or equivalent to those in FIG. 2, which illustrates the internal processing of the power source monitor 1 according to Embodiment 1, are designated by the same reference characters. When the power source SOC estimation unit 101 performs the power source SOC estimation operation, a PWM frequency changing unit 107 changes the PWM carrier frequency of the magnetic-field current PWM control signal PW inputted from the power source current control unit 102 into a frequency (e.g., 20 [kHz], away from the human zone of audibility) that is higher than the frequency at a time when normal power generation is performed, and outputs the magnetic-field current PWM control signal PW to the magnetic-field winding of the electric rotating machine 3. In this situation, the magnetic-field current PWM control signal PW outputted from the PWM frequency changing unit 107 to the magnetic-field winding of the electric rotating machine 3 has a PWM driving duty set by the power source current control unit 102 so that feedback control calculation is performed in such a way that the power source current value I becomes zero or a value near to zero.

The flow of the operation of the power source monitor according to Embodiment 2 of the present invention is similar to the flowchart of Embodiment 1 represented in FIG. 5; however, what is different from Embodiment 1 is that in the step S102 of FIG. 5, the carrier frequency of the magnetic-field current PWM control signal PW for the magnetic-field winding of the electric rotating machine 3 is set to a frequency that is higher than the frequency at a time when normal power generation is performed. The other configurations are the same as those of the power source monitor according to Embodiment 1.

The power source monitor, configured as described above, according to Embodiment 2 of the present invention eliminates high-frequency components of the power source inter-terminal voltage value to be obtained; therefore, the accuracy of the power source SOC estimation can be raised. Moreover, by setting the frequency of the magnetic-field current PWM control signal PW for the magnetic-field winding of the electric rotating machine to be higher than the frequency at a time when normal power generation is performed, the effect of pulsation caused by PWM control of the magnetic-field current is reduced; thus, the accuracies of non-energization control and the power source SOC estimation can be enhanced.

As described above, the power source monitor according to Embodiment 2 of the present invention makes it possible to obtain the power source inter-terminal voltage value and the power source current value by eliminating, from the power source inter-terminal voltage value, high-frequency components which contribute to the formation of electric double layers, by use of a filter circuit. In many cases, the pulsation of the voltage and the current generated in synchronization with the rotation of the electric rotating machine has a high frequency of 1 [kHz] or higher, and contributes to the formation of an electric double layer between the electrodes of the power source; however, because causing no ion migration or chemical reaction, the pulsation does not provide any effect to the lifetime and the safety of the power source.

In the power source monitor according to Embodiment 2 of the present invention, when power source non-energization control is performed, the carrier frequency of the magnetic-field current PWM control signal for PWM-controlling the magnetic-field current of the electric rotating machine is made higher than when normal power generation is performed so that the effect of the pulsation in the generated current and voltage, caused by the magnetic-field winding, is reduced and hence the control accuracy of power source non-energization control and the obtaining accuracy of the inter-terminal voltage are raised; therefore, the accuracy of the power source SOC estimation can be enhanced.

Embodiment 3

Next, a power source monitor according to Embodiment 3 of the present invention will be explained. In the power source monitor according to above-mentioned Embodiment 2, the PWM carrier frequency of the magnetic-field current PWM control signal for controlling the magnetic-field current of the electric rotating machine is set to be higher than the normal frequency so that the adverse effect, on the accuracy of the power source SOC estimation, of the pulsation in the generated voltage and current, caused by the PWM control of the magnetic-field current, is reduced; however, in Embodiment 3, in addition to the above-mentioned method, the PWM carrier frequency of the magnetic-field current PWM control signal for controlling the magnetic-field current of the electric rotating machine is appropriately selected so that interference in listening to an in-vehicle radio, caused by the PWM drive of the magnetic-field winding, is reduced.

Figure 8:
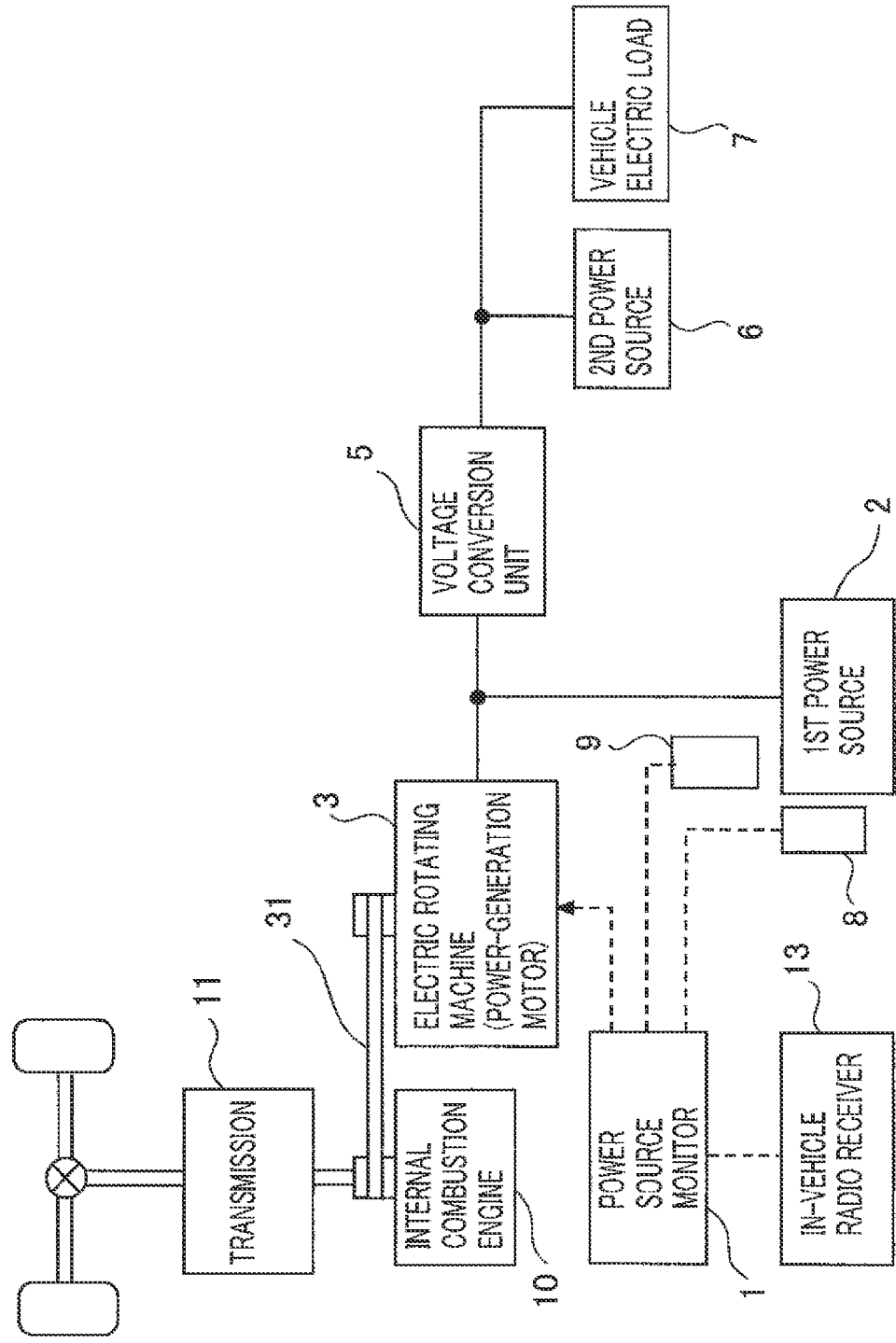
FIG. 8 is a block diagram of a vehicle provided with a power source monitor according to Embodiment 3 of the present invention.

FIG. 8 is a block diagram of a vehicle provided with a power source monitor according to Embodiment 3 of the present invention; constituent elements the same as or equivalent to those in FIG. 1 are designated by the same reference numerals. In FIG. 8, an in-vehicle radio receiver 13, which is provided with an automatic tuning function and receives medium-wave-band electric waves so as to reproduce sound, transmits, as information, the operation state and the radio tuning frequency thereof to the power source monitor 1. The foregoing automatic tuning function of the in-vehicle radio receiver 13 is to obtain a frequency at which the signal intensity becomes the same as or larger than a predetermined value, while scanning the reception electric wave frequencies. When performing automatic tuning based on the automatic tuning function in which while the reception electric wave frequencies are scanned, a frequency at which the signal intensity becomes the same as or larger than a predetermined value is obtained, the in-vehicle radio receiver 13 transmits, as information, the implementation state of the automatic tuning function to the power source monitor 1.

The in-vehicle radio receiver 13 is configured in such a way as to interrupt automatic tuning based on the automatic tuning function when the power source non-energization control unit 103 performs power source non-energization control.

The power source monitor 1 is provided with a radio operation state obtaining unit that obtains the operation state of the in-vehicle radio receiver 13, an automatic tuning state obtaining unit that obtains the fact that the automatic tuning function is carried out, and a tuning frequency obtaining unit that obtains the tuning frequency of the in-vehicle radio receiver 13; when the in-vehicle radio receiver 13 performs automatic tuning based on the automatic tuning function, the power source monitor 1 sets, for the tuning frequency f, the carrier frequency of the PWM drive signal in accordance with the equation (2) and makes the power source non-energization control unit 103 perform power source non-energization control.

$$F=(f-A/2)+[\{f-\mathrm{mod}(f,A)\}\div A] \quad (2)$$

where F is the PWM carrier frequency; f is the radio tuning frequency; A is a reference frequency (e.g., 20 kHz); mod(f, A) is the remainder of f/A.

Figure 11:
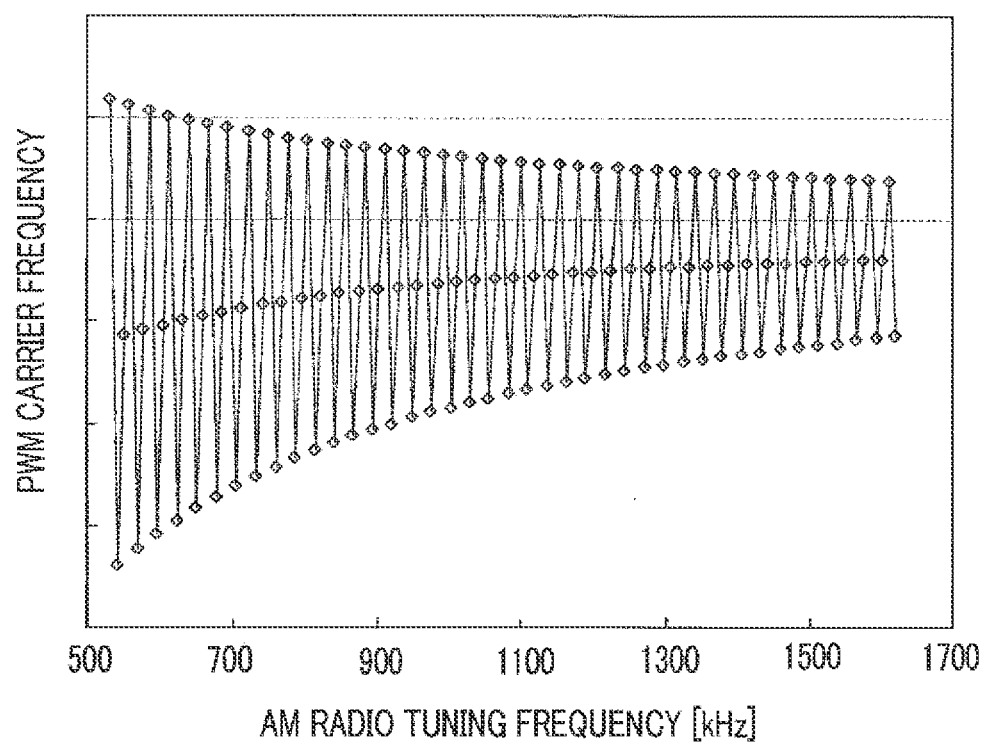
FIG. 11 is a graph representing the tuning frequencies of an in-vehicle radio receiver and the setting values of PWM carrier frequencies.

FIG. 11 is a graph representing the tuning frequencies of an in-vehicle radio receiver and the setting values of PWM carrier frequencies; this graph represents the relationship between the radio tuning frequency f and the PWM carrier frequency F at a time when the PWM carrier frequency F is set based on the foregoing equation (2). The other configurations are the same as those in FIG. 1 of Embodiment 1; therefore, the explanation therefor will be omitted.

Figure 9:
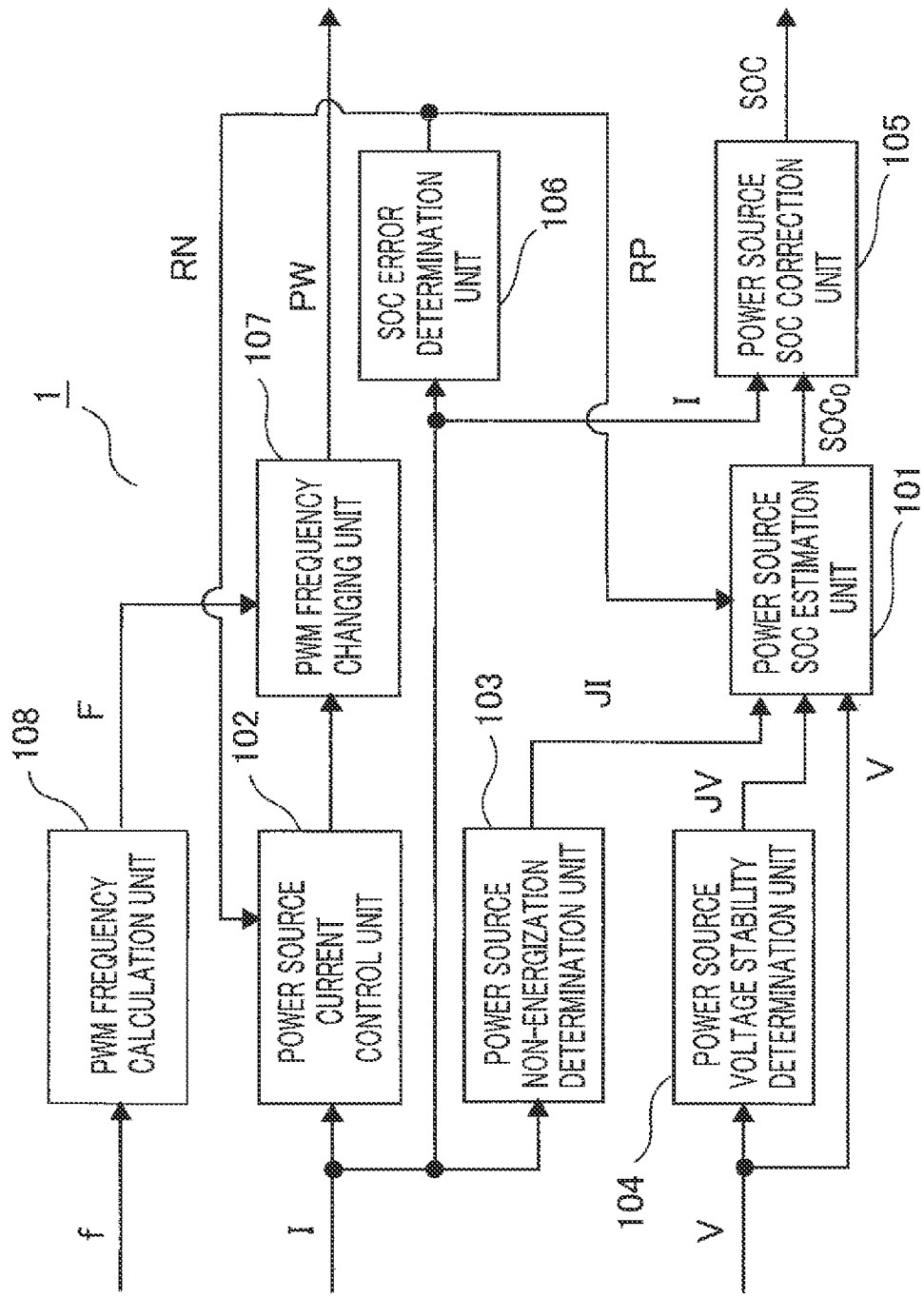
FIG. 9 is a block diagram illustrating internal processing during power-source SOC estimation operation by a power source monitor according to Embodiment 3 of the present invention.

FIG. 9 is a block diagram illustrating internal processing during power-source SOC estimation operation by a power source monitor according to Embodiment 3 of the present invention; constituent elements the same as or equivalent to those in FIG. 7 are designated by the same reference characters. What is different from FIG. 7 is that there are added the radio operation state obtaining unit (unillustrated) that obtains the operation state of the in-vehicle radio receiver 13, the automatic tuning state obtaining unit (unillustrated) that obtains the fact that the automatic tuning function is carried out, and a PWM frequency calculation unit 108. In FIG. 9, based on an obtained radio tuning frequency, the PWM frequency calculation unit 108 calculates a PWM carrier frequency (e.g., 20 [kHz], away from the human zone of audibility) that is higher than the frequency at a time when normal power generation is performed and hence whose high-order harmonics do not interfere in the radio tuning frequency, and outputs the PWM control frequency to the PWM frequency changing unit 107.

The PWM frequency changing unit 107 changes the PWM carrier frequency of the magnetic-field current PWM control signal PW inputted from the power source current control unit 102 into the frequency calculated by the PWM frequency calculation unit 108, and outputs the changed magnetic-field current PWM control signal PW to the magnetic-field winding of the electric rotating machine 3. In this situation, the magnetic-field current PWM control signal PW outputted from the PWM frequency changing unit 107 to the magnetic-field winding of the electric rotating machine 3 has a PWM driving duty set by the power source current control unit 102 so that feedback control calculation is performed in such a way that the power source current value I becomes zero or a value near to zero.

Figure 10:
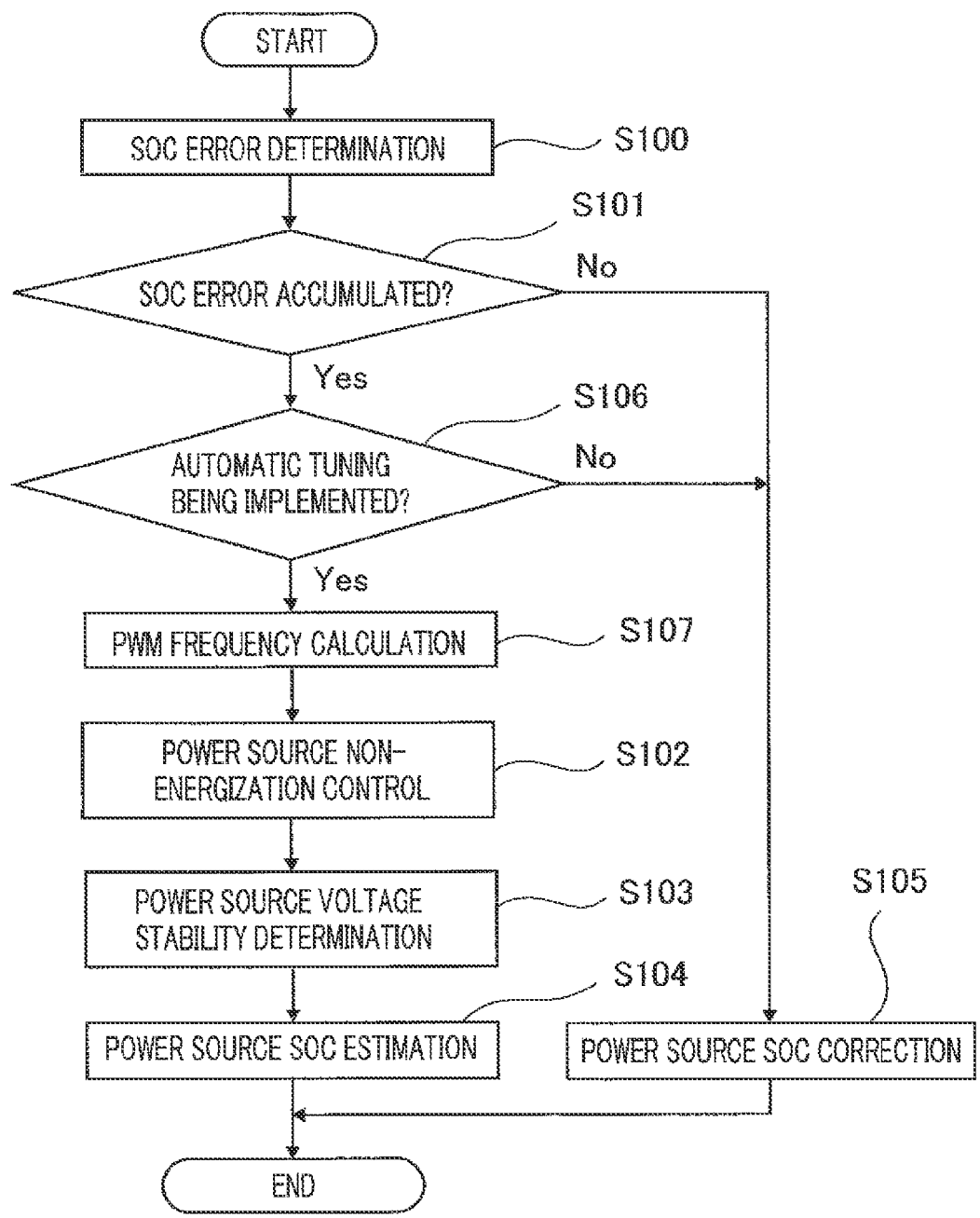
FIG. 10 is a flowchart representing the flow of processing by a power source monitor according to Embodiment 3 of the present invention.

Next, the operation of the power source monitor according to Embodiment 3 of the present invention will be explained. FIG. 10 is a flowchart representing the flow of the operation of the power source monitor according to Embodiment 3 of the present invention; this processing is repeated every predetermined period. In the flowchart in FIG. 10, constituent elements the same as or similar to those in the flowchart represented in FIG. 5 of Embodiment 1 are designated by the same reference characters.

In FIG. 10, at first, in the step S100, the SOC error determination unit 106 calculates the integration value of the absolute values of the power source current values I obtained after the last-time power source SOC estimation so as to start the SOC error determination processing; in the step S101, the SOC error determination unit 106 determines whether or not the integration value, calculated in the step S100, of the absolute values of the power source current values I has exceeded a predetermined accumulated error allowable current integration value. In the case where in the step S101, it is determined that the integration value of the absolute values of the power source current values I has exceeded the predetermined accumulated error allowable current integration value (Yes), it is determined that the error in the power source SOC estimation value has accumulated and hence the reliability has deteriorated, and then the step S101 is followed by the step S106; in the case where it is determined that the integration value of the absolute values of the power source current values I has not exceeded the predetermined accumulated error allowable current integration value (No), the step S101 is followed by the step S105.

In the step S106, it is determined whether or not the in-vehicle radio receiver is performing automatic tuning based on the automatic tuning function; in the case where the in-vehicle radio receiver is not performing automatic tuning (No), the step S106 is followed by the step S105; in the case where the in-vehicle radio receiver is performing automatic tuning (Yes), the step S106 is followed by the step S107. In the step S107, a PWM carrier frequency whose high-order harmonics do not interfere in in-vehicle radio tuning frequencies is calculated; then, the step S107 is followed by the step S102. In the step S102, the power source current control unit 102 outputs the magnetic-field current PWM control signal PW to the electric rotating machine 3 so as to perform non-energization control in such a way that the obtained power source current value I becomes zero or near to zero; the PWM frequency changing unit 107 changes the carrier frequency of the magnetic-field current PWM control signal PW supplied to the magnetic-field winding of the electric rotating machine 3 into the PWM carrier frequency calculated in the step S107.

When due to the power source non-energization control in the step S102, the power source current value I becomes zero or near to zero, the power source current control unit 102 determines that energization is not performed, and outputs the determination result JI; then, the step S102 is followed by the processing in the step S103. In the step S103, in the case where during the power source voltage stability determination period $\Delta t$ represented in FIG. 3, the variation in the power source inter-terminal voltage value V is within a predetermined power source voltage stability determination threshold value, the power source voltage stability determination unit 104 determines that the power source voltage has stabilized, and then outputs the determination result JV; then, the step S103 is followed by the processing in the step S104. In the step S104, based on the obtained power source inter-terminal voltage value V, the power source SOC estimation unit 101 obtains the power source SOC estimation value $SOC_0$ with reference to the power source SOC estimation map represented in FIG. 4; then, the processing is ended.

In contrast, in the case where in the step S101, it is determined that the integration value of the absolute values of the power source current values I has not exceeded the predetermined accumulated error allowable current integration value (No), the step S101 is followed by the processing in the step S105; the power source SOC correction unit 105 integrates the absolute values of the obtained power source current values I and, based on the integration value, corrects power source SOC estimation value $SOC_0$ obtained in the foregoing step S104 so as to create the power source SOC estimation value SOC; then, the processing is ended.

Also in the case where it is determined in the step S106 that the in-vehicle radio receiver is not performing automatic tuning based on the automatic tuning function (No) and the step S106 is followed by the step S105, the power source SOC correction unit 105 integrates the absolute values of the obtained power source current values I and, based on the integration value, corrects power source SOC estimation value $SOC_0$ obtained in the foregoing step S104 so as to create the power source SOC estimation value SOC; then, the processing is ended.

As described above, the power source monitor according to Embodiment 3 of the present invention makes it possible that when an in-vehicle radio receiver operates, the high-order harmonics of the magnetic-field current PWM control signal for the magnetic-field winding of the electric rotating machine are prevented from providing an adverse effect to radio listening; therefore, when the in-vehicle radio receiver implements the automatic tuning function, the processing by the power source monitor does not cause any erroneous radio-station detection.

Moreover, the power source monitor according to Embodiment 3 of the present invention makes it possible that when the in-vehicle radio receiver operates, the magnetic-field current of the electric rotating machine is PWM-controlled in such a way that there is avoided the carrier frequency that is the reciprocal of an integer of a frequency to which the in-vehicle radio receiver is tuned, so that the power source SOC estimation is performed under the condition that the adverse effect of the high-order harmonics of the PWM carrier frequency causes no noise in listening to the radio.

Still moreover, the power source monitor according to Embodiment 3 of the present invention makes it possible that when the in-vehicle radio receiver performs the automatic tuning function, the power source SOC estimation is interrupted so that the high-order harmonics of the PWM carrier frequency of the magnetic-field current PWM control signal are prevented from causing a radio station to be erroneously detected when the automatic tuning function is performed.

Various modifications and alterations of this invention will be apparent to those skilled in the art without departing from the scope and spirit of this invention, and it should be understood that this is not limited to the illustrative embodiments set forth herein.

What is claimed is:

1. A power source monitor that is mounted in a vehicle equipped with an electric rotating machine performing driving-power communication with an internal combustion engine, as a driving power source for a vehicle, and a power source apparatus being provided with an electricity storage function and performing electric-power communication with the electric rotating machine, and that monitors at least a state of charge of the power source apparatus, the power source monitor comprising:
   a power source current control unit that controls a magnetic-field current PWM control signal for PWM-controlling a magnetic-field current of the electric rotating machine so that the value of a power source current flowing in the power source apparatus can be controlled to be zero or a value near to zero;
   a power source non-energization determination unit that determines whether or not the value of the power source current flowing in the power source apparatus is zero or a value near to zero;
   a power source voltage stability determination unit that determines whether or not a variation in a power source inter-terminal voltage value of the power source apparatus is within a predetermined range during a predetermined period, when the power source non-energization determination unit determines that the value of the power source current is zero or a value near to zero; and
   a power source SOC state estimation unit that estimates a state of charge of the power source apparatus, based on the voltage value of the power source apparatus, when the power source voltage stability determination unit determines that the variation in the power source inter-terminal voltage value is within the predetermined range; and
   a PWM frequency changing unit that changes a carrier frequency of the magnetic-field current PWM control signal into a frequency different from the frequency at a time when the electric rotating machine performs normal power generation, when the power source SOC estimation unit estimates the state of charge;
   wherein based on a state of charge estimated by the power source SOC estimation unit, the state of charge of the power source apparatus is monitored.

2. The power source monitor according to claim 1, further including a power source SOC error determination unit that obtains an integration value of the absolute values of the power source current values obtained after the power source SOC estimation unit estimates the state of charge, and that determines that there exists an error in the estimation of the state of charge of the power source, when the integration value exceeds a predetermined value, and then instructs the power source SOC estimation unit to estimate the state of charge again.

3. The power source monitor according to claim 2, further including a power source SOC estimation correction unit that obtains an integration value of the power source current values and corrects a estimation value of a state of charge of the power source which estimated based on the integration value by the power source SOC estimation unit.

4. The power source monitor according to claim 3, wherein in the case where the power source SOC error determination unit does not determine that there exists an error in the estimation of a state of charge, the power source SOC estimation correction unit corrects the estimation value of state of charge of the power source.

5. The power source monitor according to claim 1, further including a filter circuit that eliminates voltage oscillations having a frequency of a predetermined-value or higher among voltage oscillations in the power source inter-terminal voltage value.

6. The power source monitor according to claim 1, wherein the vehicle is equipped with an in-vehicle radio receiver; there is provided a PWM frequency calculation unit that calculates a frequency into which the carrier frequency is changed based on a tuning frequency of the in-vehicle radio receiver, while the in-vehicle radio receiver operates; and the PWM frequency changing unit changes the carrier frequency of the magnetic-field current PWM control signal into a frequency calculated by the PWM frequency calculation unit.

7. The power source monitor according to claim 1, wherein the power source SOC state estimation unit estimates a state of charge of the power source, based on a map in which a estimation value of state of charge of the power source for the power source inter-terminal voltage value is stored.

8. A power source monitor that is mounted in a vehicle equipped with an electric rotating machine performing driving-power communication with an internal combustion engine, as a driving power source for a vehicle, and a power source apparatus being provided with an electricity storage function and performing electric-power communication with the electric rotating machine, and that monitors at least a state of charge of the power source apparatus, the power source monitor comprising:
   a power source current control unit that controls a magnetic-field current PWM control signal for PWM-controlling a magnetic-field current of the electric rotating machine so that the value of a power source current flowing in the power source apparatus can be controlled to be zero or a value near to zero;
   a power source non-energization determination unit that determines whether or not the value of the power source current flowing in the power source apparatus is zero or a value near to zero;
   a power source voltage stability determination unit that determines whether or not a variation in a power source inter-terminal voltage value of the power source apparatus is within a predetermined range during a predetermined period, when the power source non-energization determination unit determines that the value of the power source current is zero or a value near to zero; and
   a power source SOC state estimation unit that estimates a state of charge of the power source apparatus, based on the voltage value of the power source apparatus, when the power source voltage stability determination unit determines that the variation in the power source inter-terminal voltage value is within the predetermined range;

wherein based on a state of charge estimated by the power source SOC estimation unit, the state of charge of the power source apparatus is monitored, wherein the vehicle is equipped with a radio receiver having an automatic tuning function in which while reception frequencies are scanned, a frequency at which a signal intensity becomes the same as or larger than a predetermined value is obtained and is recognized as a radio station frequency; and wherein the power source SOC estimation unit discontinues or temporarily discontinues the estimation of the state of charge of the power source when the in-vehicle radio receiver implements automatic tuning operation based on the automatic tuning function.

9. The power source monitor according to claim 8, wherein the power source SOC state estimation unit estimates a state of charge of the power source, based on a map in which a estimation value of state of charge of the power source for the power source inter-terminal voltage value is stored.

10. The power source monitor according to claim 8, further including a power source SOC error determination unit that obtains an integration value of the absolute values of the power source current values obtained after the power source SOC estimation unit estimates the state of charge, and that determines that there exists an error in the estimation of the state of charge of the power source, when the integration value exceeds a predetermined value, and then instructs the power source SOC estimation unit to estimate the state of charge again.

11. The power source monitor according to claim 10, further including a power source SOC estimation correction unit that obtains an integration value of the power source current values and corrects an estimation value of a state of charge of the power source which estimated based on the integration value by the power source SOC estimation unit.

12. The power source monitor according to claim 11, wherein in the case where the power source SOC error determination unit does not determine that there exists an error in the estimation of a state of charge, the power source SOC estimation correction unit corrects the estimation value of state of charge of the power source.

13. The power source monitor according to claim 8, further including a filter circuit that eliminates voltage oscillations having a frequency of a predetermined-value or higher among voltage oscillations in the power source inter-terminal voltage value.

* * * * *